(12) United States Patent
Spampinato (10) Patent No.: US 6,522,177 B1
(45) Date of Patent: Feb. 18, 2003

(54) FREQUENCY SYNTHESIS DEVICE

(75) Inventor: Eric Daniel Jean Philippe Spampinato, Langouët (FR)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/661,256

(22) Filed: Sep. 13, 2000

(30) Foreign Application Priority Data

Sep. 17, 1999 (FR) .............................................. 99 11668

(51) Int. Cl.⁷ ................................ H04B 1/16; H03J 7/18
(52) U.S. Cl. ........................ 327/107; 327/105; 327/156; 455/260; 455/183.1; 331/18
(58) Field of Search ................................ 327/105, 106, 327/107, 156; 331/18, 1 R, 25; 455/260, 80, 183.1

(56) References Cited

U.S. PATENT DOCUMENTS

| | | | |
|---|---|---|---|
| 4,551,856 A | * 11/1985 | Victor et al. | 455/183 |
| 4,926,130 A | * 5/1990 | Weaver | 327/105 |
| 5,179,729 A | * 1/1993 | Mishima et al. | 455/260 |
| 5,423,076 A | * 6/1995 | Westergren et al. | 455/86 |
| 5,801,589 A | 9/1998 | Tajima et al. | 331/1 R |
| 5,859,570 A | 1/1999 | Ioh et al. | 331/18 |
| 6,081,226 A | * 6/2000 | Caldwell et al. | 342/200 |
| 6,185,255 B1 | * 2/2001 | Twitchell et al. | 375/240.25 |

FOREIGN PATENT DOCUMENTS

EP 0429858 A2 6/1991

OTHER PUBLICATIONS

Tajima K et al: "A 5 to 10GHZ Low Spurious Triple Tuned Type PLL Synthesizer Driven By Frequency Converted DDS Unit" IEEE MTT–S International Microwave Symposium Digest, US, New York, IEEE, 1997, pp. 1217–1220, XP000767019 ISBN: 0–7803–3815–4.

* cited by examiner

Primary Examiner—Dinh T. Le
(74) Attorney, Agent, or Firm—Tarolli, Sundheim, Covell, Tummino & Szab L.L.P.

(57) ABSTRACT

The invention relates to a frequency synthesis device comprising a direct digital synthesis device (22) for producing by calculation a signal oscillating at a determined frequency (Fdds), the calculation being performed by a logic circuit clocked by a clock signal (Sh) having a determined clock frequency (Fh), characterized in that it further comprises transposition means (74) for transposing the signal which oscillates at the determined frequency (Fdds) using the clock frequency signal (Sh), the signal thus transposed being supplied as an output (Sref).

27 Claims, 4 Drawing Sheets

FREQUENCY SYNTHESIS DEVICE

BACKGROUND OF THE INVENTION

1. Technical Field

The present invention relates to the field of frequency synthesis, and more particularly to frequency synthesis with high spectral purity.

2. Description of the Prior Art

It is recalled here that frequency synthesis is the technique of generating a signal oscillating at an adjustable frequency with high precision and high spectral purity. Frequency synthesis is very widely used in different areas of electronics, for example in radio and TV signal broadcast and reception, telecommunications, instrumentation, clock signal generation, etc.

At present, frequency synthesis is generally produced from one or several circuits known as phase locked loops (PLL). In this case, the synthesis is "indirect", inasmuch as the signal produced at the output is generated by an oscillator different from the reference source.

A PLL circuit can produce at its output a signal which is variable by frequency jumps from a signal of fixed frequency, referred to as the reference frequency.

Figure 1:
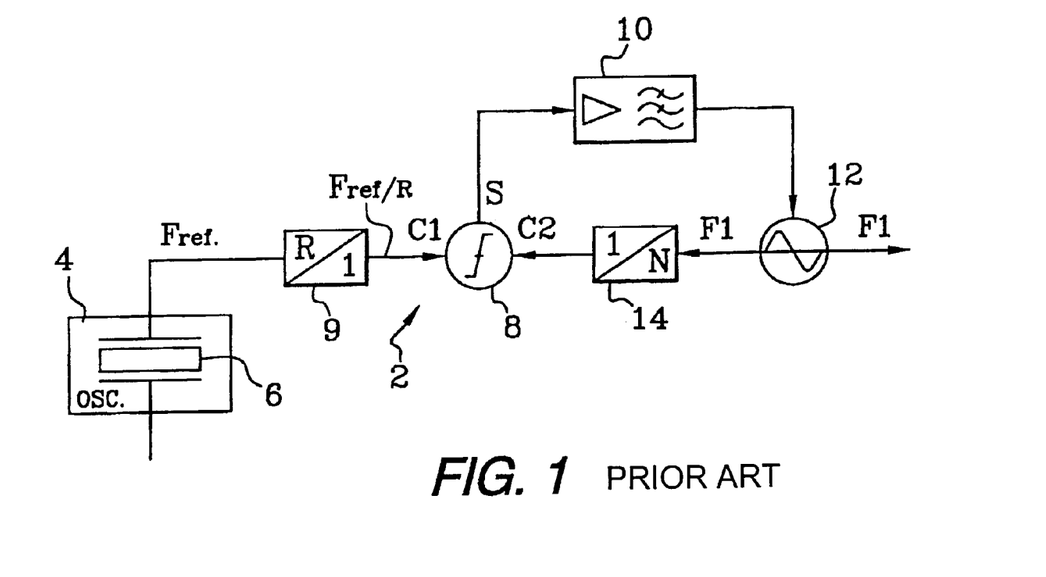
FIG. 1, already described, is a simplified block diagram of a classical indirect frequency synthesis circuit based on a phase locked loop.

FIG. 1 is a diagram which shows schematically the main elements that form a classical PLL circuit. The above-mentioned reference frequency Fref is produced by an oscillator circuit 4 whose time base is generally a quartz crystal 6. The signal at the frequency Fref is sent to a first comparison input C1 of a phase comparator 8 via a divider 9 programmable for the reference frequency; the second comparison input C2 of the phase comparator 8 receives the output signal from a voltage controlled oscillator (VCO) 12 after a frequency division by a factor N, as shall be explained further.

The programmable divider 9 allows to select the exact desired frequency at input C1 of the phase comparator 8 as a function e.g. of the frequency plan established for the oscillating system into which the PLL circuit is integrated. Its function is to divide the frequency Fref at the input by a programmable factor R, where R is an integer or a fraction. The frequency at the output of the divider 9 is thus Fref/R.

The pulse-like signal at the output S of the phase comparator 8, after integration by a low-pass filter 10, appears in the form of a voltage whose magnitude is proportional to the phase difference between the signals applied at the first and second comparison inputs C1 and C2.

The low-pass filter 10 serves to integrate the current or voltage fluctuations arising from the phase comparison performed by the comparator 8, so that the oscillator 12 can correctly follow the evolutions of that signal while complying to the stability criteria according to the theory of feedback controlled systems.

The pulse-like voltage or current is first supplied to a low-pass filter 10, and thereafter to the voltage-controlled oscillator 12. The latter produces a signal whose frequency F1 is proportional to this control voltage and which, in the circuit considered, also constitutes the output frequency F1 of the PLL.

A feedback of this output signal from oscillator 12 to the phase comparator 8 passes through a frequency divider 14, such that the signal supplied at the second comparison input C2 of the comparator 8 has a frequency equal to F1/N at the feedback, where N is an integer or a fraction.

The phase comparator 8 thus produces at its output S a signal whose magnitude is proportional to the phase difference between this signal of frequency F1/N and the phase of the reference signal, possibly after a frequency division by the divider circuit 9. It shall be understood that when N is varied by programming, the oscillator 12 shall see its frequency vary correspondingly up to the point where the two comparison signals are in phase.

When this condition is reached, the loop is in the stable mode and we have, at the level of the comparator, the identity F1/N=Fref/R. Thus, the frequency F1 at the output is N/R times Fref. The PLL equation is stable for Fref/R= F1/N, whence an output frequency of: F1 =(N/R)Fref.

By programming the values N and R, it is possible to obtain, from the reference signal of fixed frequency Fref, a range of frequencies of which each frequency is an integral or fractional multiple of that reference frequency. The reference frequency Fref therefore establishes the resolution in frequency variation, the latter only occurring in jumps of Fref or Fref(N/R).

There also exists another frequency synthesis technique which is known as direct digital synthesis (DDS). This approach consists in mathematically constructing, in an autonomous fashion, a signal having a desired waveform (generally sinusoidal) by directly calculating trigonometrical values for each phase angle increment of the signal considered. Such a circuit shall be briefly described with reference to FIG. 2.

Figure 2:
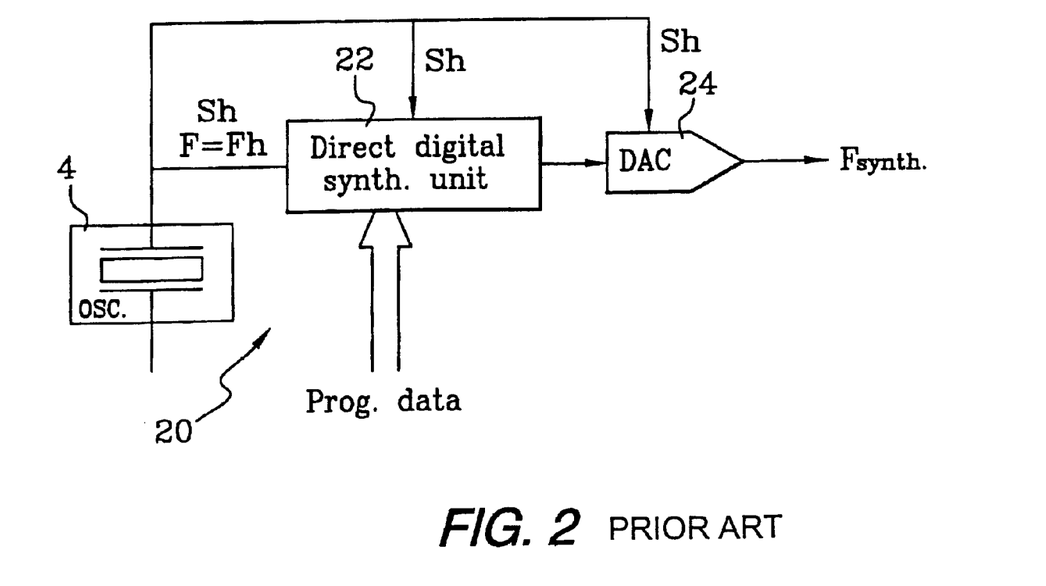
FIG. 2, already described, is a simplified block diagram of a classical direct frequency synthesis circuit based on a direct digital frequency synthesis circuit.

The calculation of these trigonometrical values is performed by a direct digital synthesis block formed by a trigonometrical calculation unit 22. This unit operates in synchronous binary logic from a clock signal Sh supplied by an oscillator circuit 4 which can be of the same type as presented in the context of FIG. 1. Each digital sample thus obtained is then transformed into a voltage value using a digital-to-analog converter 24. The evolution of this voltage in concert with the execution of the successive calculations reproduces the desired waveform at the desired frequency Fsynth. Generally, each calculation of a trigonometric value for a given angle is performed in pace with a cycle of the clock Fh of the oscillator circuit 4. Also, to obtain a signal having good resolution, it is necessary to dispose of a relatively dense number of calculation points for each cycle reproduced. According to the theory of sampled systems, the clock frequency Fh must be higher than the frequency of the reproduced signal Fdds, the optimization typically being obtained when the clock signal frequency is greater by a factor at least equal to three times that frequency.

Nowadays, with digital architectures becoming increasingly integrated, direct digital synthesis is technically and economically feasible, but it is implemented in conjunction with indirect synthesis to offer solutions that meet frequency synthesis requirements of the new telecommunications systems, which are always demanding as regards spectral quality and frequency resolution, as well as in precision and frequency stability.In this context, indirect synthesis uses frequency transposition architectures with interlocked PLLs in view of minimizing phase noise at the output. These loops are difficult to implement as regards both feedback stability criteria and spurious spectral spikes. Moreover, the practical aspects of their construction pose problems, especially as regards presetting the oscillators so as to be in the capture range. This problem is linked to the narrow bandwidth of beats at the outputs of mixers associated with the phase comparators. The beat frequencies used are moreover undesirable at the spectrum output. It is also necessary to manage an approach voltage for the output oscillator. Consequently, achieving a frequency synthesis calls for a compromise to be made between a high comparison frequency, a small increment resolution, a high frequency acquisition speed, and an adequate band coverage at the output, requiring the use of broadband oscillators. These problems of frequency synthesis shall now be described in the context of a concrete example based on a digital radio or TV transmitter in the UHF band. Efforts in this field are directed to digital modulation transmission systems for both television and radio. Compared to analog transmissions, digital technology allows a much denser occupation of the spectrum and a greater immunity to noise and interference problems. As regards radio frequency broadcasting, present day digital TV and radio broadcasting programs (also known as DAB or DVBT respectively for digital audio broadcasting and digital video broadcasting terrestrial) aim to exploit the UHF IV and V and VHF band III carrier frequency bands.

The modulation technique envisaged is coded orthogonal frequency division multiplex (COFDM). This protocol is used in particular for use in the European standards.

Such a modulation technique is in itself well known, being described notably in patent documents EP-A-0 902574 and WO-A-98 11698. Only the basic concepts shall be recalled here, with reference to FIG. 3.

Figure 3:
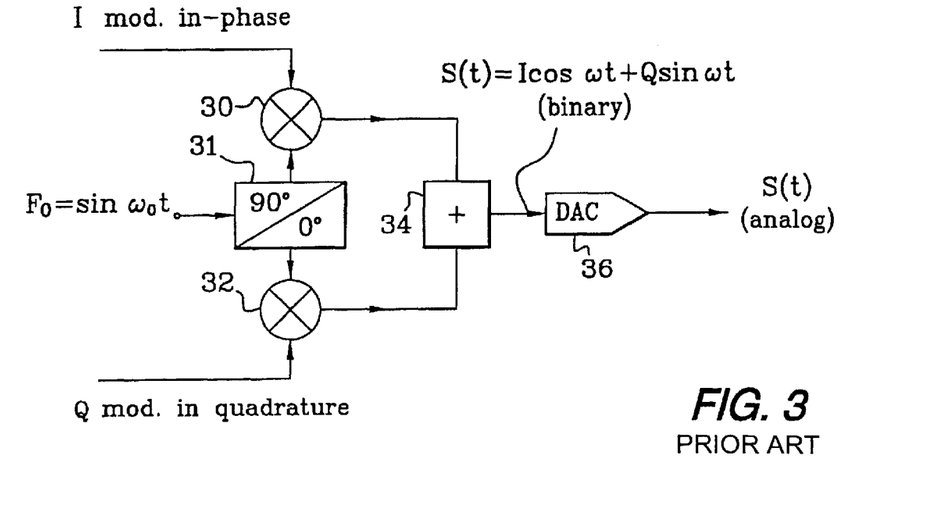
FIG. 3, already described, is a simplified block diagram of a modulation stage in accordance with the COFDM technique.

This simplified diagram shows the functional blocks which enable a phase quadrature modulated analog signal to be produced from two input signals I and Q. The two signals carry modulated information and are modulated in quadrature. These signals are supplied at inputs of respective mixers 30, 32 which also receive signals from a phase shifter 31. The latter receives at an input a signal at the frequency Fsystem established for the system. The two respective mixers 30, 32 thus supply digital signals which are sent to the respective inputs of an adder circuit 34. The output S(t) of the mixer 34 is a time-varying trigonometrical function given by: $S(t) = I \cos \omega\tau - Q \sin \omega\tau$, where I and Q are numerical coefficients, $\omega$ is the phase angle, and $\tau$ is time.

Figure 4:
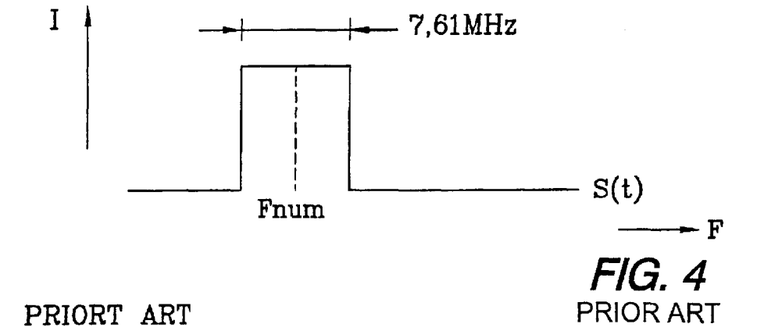
FIG. 4, already described, shows the frequency spectrum from the modulation stage of FIG. 3.

Signal S(t) is generally a signal comprising a large number of carriers, for example 6817 carriers on a 7.61 MHz band, as shown by FIG. 4. This signal comprises a central frequency denoted Fnum positioned at a frequency on the order of 18 MHz.

Figure 5:
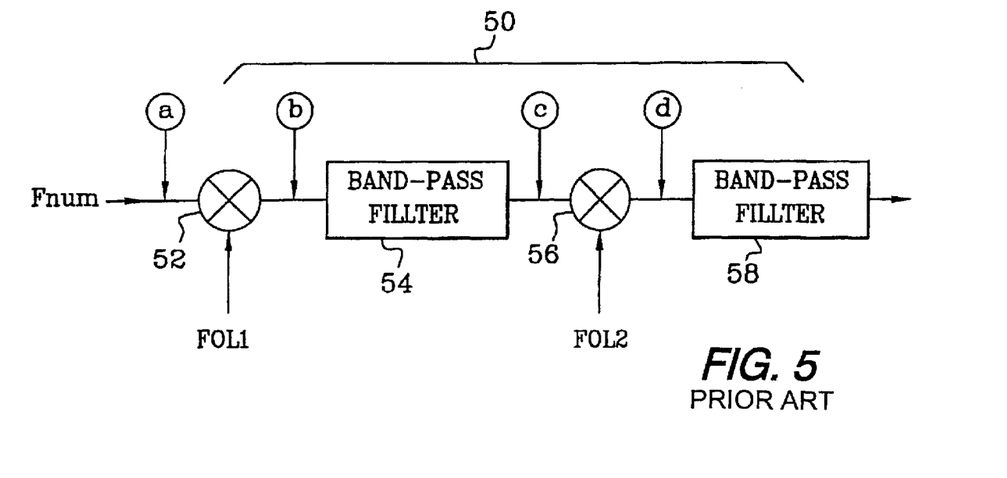
FIG. 5, already described, is a simplified block diagram of a frequency transposition circuit for the signal shown in FIG. 2, in accordance with the state of the art.
Figure 6:
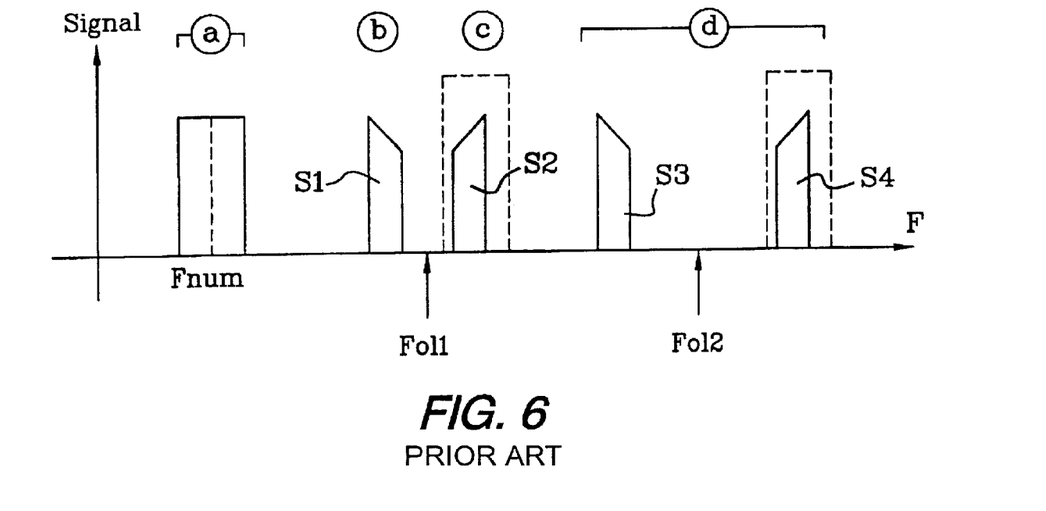
FIG. 6, already described, shows the signals at different points of the circuit shown in FIG. 3.

Before this signal can be power amplified, it is first necessary to transpose the frequency Fnum to a higher frequency in the UHF band. To do this, the current solution is a two-stage transposition, as shown schematically in FIG. 5. The different points of the circuit of FIG. 5 are identified by references (a) to (d); the signals at these reference points are shown in FIG. 6, which is a graph showing frequency along the x-axis and signal level along the y-axis.

Signal S(a) at central frequency Fnum is processed by a classical two-stage transposition heterodyne circuit 50. The signal at the input (a) passes through a first mixer circuit 52 where it is mixed with a signal OL1 having a fixed frequency Fol1 greater than the frequency Fnum. This mixer circuit 52 produces two spectra S1 and S2 at its output (b) (FIG. 6) from the signal of mixture OL1, corresponding respectively to the difference and the sum of the mixed frequencies. These two spectra are separated by a first band-pass type filter 54 which only passes on the frequency spectrum S2 of the upper mixed frequency (c). Because the two spectra are very close in frequency, this separation must be performed by a very selective filter. A surface acoustic wave (SAW) filter is generally used for that purpose. This spectrum is then applied at the input of a second mixer 56 which also receives as an input a signal OL2 at a mixing frequency Fol2 greater than Fol1. As for the first mixer circuit 52, the second mixer circuit 56 yields two spectra S3 and S4 respectively corresponding to the difference and sum of frequencies passed by the first filter 54 and the signal of frequency Fol2.

Frequencies Fol1 and Fol2 of signals OL1 and OL2 are selected so that the upper frequency spectrum S4 corresponds to the desired frequency band (viz UHF band IV or V in the example considered).

This spectrum S4 is kept while eliminating the other spectrum S3 by a second band-pass filter 58.

The second filter 58 is fixed in frequency. In other words, it selects just one frequency—or narrow range of frequencies—by eliminating all the others. This filter is thus selected to be tuned to the desired output frequency.

The problem which arises in this context lies in synthesizing the frequencies Fol1 and Fol2 by the signals OL1 and OL2 for the transposition oscillators required for the transposition. This implies two changes in frequency of a signal modulated and centered around a frequency Fnum to generate the modulated signal centered at a frequency in the band for covering the UHF or VHF frequency bands used in TV broadcasting (band III in VHF and bands IV and V in UHF).

The frequency increments must be small (1 Hz) with a frequency precision tolerance less than or equal to 0.5 Hz. The invention allows to achieve a precision of 0.1 Hz. The phase noise must be within a spectral template in accordance with the recommendations of the European project "Validate" in complement to the ETS300 744 standard defining the COFDM for DVB-T, which figures in table I below.

TABLE I

| admissible shift values according to European project "Validate". | |
|---|---|
| Shift | Validate AC106 ETS 300 744 specification in dBc/Hz |
| 10 Hz | <−55 |
| 100 Hz | <−85 |
| 1 kHz | <−85 |
| 10 kHz | <−95 |
| 100 kHz | <−115 |
| 1 MHz | <−130 |

STATEMENT OF THE INVENTION

In view of these different problems, a first object of the present invention is to propose a frequency synthesis circuit comprising a direct digital synthesis device for producing by calculation a signal oscillating at a determined frequency, the calculation being performed by a logic circuit clocked by a clock signal having a determined clock frequency, characterized in that it further comprises transposition means for transposing the signal which oscillates at the determined frequency using the clock frequency signal, the signal thus transposed being supplied as an output.

Preferably, the frequency transposition is performed by summing means for summing the clock frequency and the determined frequency outputted from the direct digital synthesis device.

In this case, the summing means can comprise a mixer having a first input for receiving the oscillating signal produced by the direct digital synthesis device, a second input for receiving the clock signal and an output supplying the sum and the difference of the frequencies of clock signal and the oscillating signal outputted by the direct digital synthesis device.

Advantageously, the circuit further comprises filtering means (for example a band-pass filter) for filtering the oscillating signal outputted from the direct digital synthesis device upstream of the transposition means.

In a preferred embodiment, the direct digital synthesis device comprises a direct digital synthesis unit producing digital numbers corresponding to trigonometrical values of successive phase angles, comprising a memory for a sinusoidal waveform, and a digital-to-analog converter for converting the values into analog voltages, the converter being clocked by the clock signal from the oscillator.

Still in a preferred embodiment, the circuit comprises an oscillator which produces the clock signal at a frequency on the order of 10 MHz.

In this case, the frequency produced by the direct digital frequency synthesis device is on the order of 2.25 MHz, so that, after transposition by the frequency, the signal at the output is on the order of 12.25 MHz.

Another object of the invention is to propose a frequency transposition device comprising:

at least one phase locked loop means delivering at an output a signal of intermediate frequency from a reference frequency signal having a predetermined frequency;

frequency transposition means comprising an input for a signal to be transposed, an output for a signal transposed in frequency and at least one input for an intermediate frequency signal connected to a respective output of the phase locked loop means;

characterized in that the reference signal is supplied by the output of a frequency synthesis circuit according to any one of the characteristics described in connection with the first object of the invention.

The or each phase locked loop can comprise a programmable divide by R (or T) means operative on the frequency of the reference signal, where R (or T) is an integer or a fraction.

The frequency transposition means can comprise, for the or each phase locked loop, a mixer having a first input for receiving either the input signal to be transposed, or an intermediate transposition of that signal, and a second input for receiving a signal of intermediate frequency from a respective phase locked loop, and an output for the mixture of the frequencies of the signals.

Preferably, the phase locked loop means comprises a number k of phase locked loops, where k is an integer greater than 1, each receiving in a symmetrical and balanced manner the reference signal at an input. This number k is advantageously equal to 2, especially for frequency transposition applications involving a double transposition.

In a preferred embodiment, one of the mixers receives at its first input the input signal to be transposed and supplies at its output a signal which is applied to the first input of a mixer located downstream, via a band-pass filter.

Preferably:
the clock frequency of the oscillator is on the order of 10 MHz;
the reference frequency of the signal produced by the frequency synthesis circuit is on the order of 12.25 MHz;
a first of the phase locked loops serving to produce the signal for a first mixer has a frequency on the order of 120 MHz;
a second of the phase locked loops serving to produce the signal for a second mixer has a frequency on the order of 330 to 720 MHz.

A further object of the invention is the use of a circuit of the above type for the transposition of a modulated signal for transmission, to a VHF or UHF frequency range.

Note that the present invention also makes it possible to produce the reverse function, i.e. it can have for object the use of a circuit described above for the downward transposition of a signal modulated in the VHF or UHF frequency range to a low frequency modulated signal.

Another object of the invention is the use of a circuit as described above for driving a power amplification circuit of a transmitter with a modulated signal transposed in frequency.

The invention can also constitute a method of frequency synthesizing at a frequency not modulated at an output by transposing a non-modulated signal Fnum, for example the frequency Fh.

Another object of the present invention is a method of frequency synthesizing using a direct digital synthesis device serving to produce by calculation a signal oscillating at a determined frequency, the calculation being performed by a logic circuit clocked by a clock signal having a determined clock frequency, characterized in that the signal oscillating at the determined frequency is transposed by the frequency of the clock signal, the signal thus transposed being supplied as an output.

Finally, the invention concerns a method of transposing a frequency using a circuit comprising:

at least one phase locked loop means delivering at an output a signal of intermediate frequency from a reference frequency signal having a predetermined frequency;

frequency transposition means comprising an input for a signal to be transposed, an output for a signal transposed in frequency and at least one input for an intermediate frequency signal connected to a respective output of the phase locked loop means;

characterized in that the reference signal is supplied in accordance with a frequency synthesis method according to any one of claims.

It is to be understood that all the optional characteristics having been set forth in the context of the circuits according to the invention apply mutatis mutandis to the method set out above; the same shall apply to the description which follows of preferred embodiments.

BRIEF DESCRIPTION OF THE DRAWINGS

The invention will now be described, by way of example, with reference to the accompanying drawings in which.

DETAILED DESCRIPTION OF THE INVENTION

Figure 7:
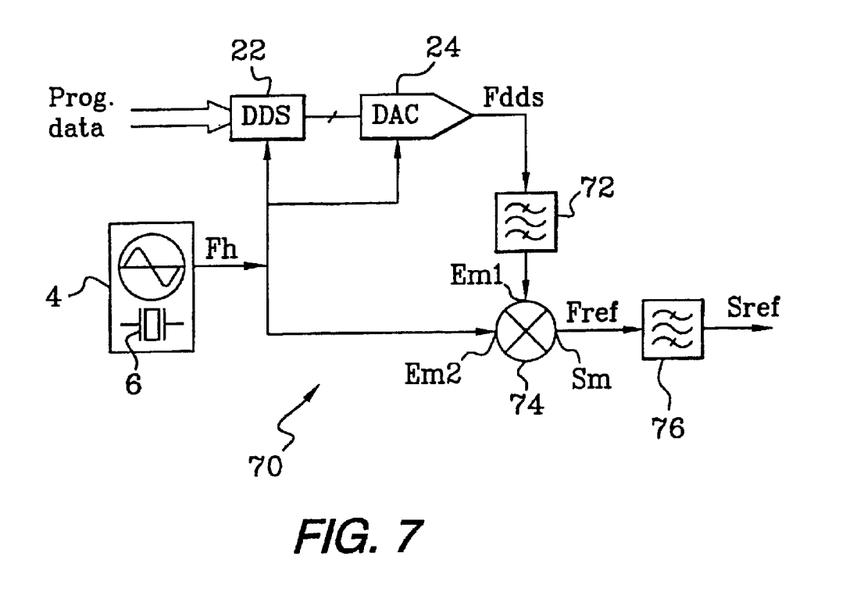
FIG. 7 is a block diagram of a frequency synthesizer in accordance with the present invention.

FIG. 7 is a simplified representation of the main elements of a frequency synthesis circuit in accordance with the present invention.

The circuit 70 comprises an oscillator 4 having a time base set by a quartz crystal 6 whose fundamental frequency Fh in the example is 10 MHz.

The output of the oscillator 4 is connected to the clock input Fh of a classical direct digital frequency synthesis (DDS) unit 22, such as described with reference to FIG. 2. As explained above, this unit receives programming data enabling it to produce the trigonometrical calculation values for successive phase angles using a synchronous logic clocked by the oscillator 4. These successive trigonometrical values are supplied to the input of a digital-to-analog converter 24 which produces in response a voltage signal which evolves as a function of the trigonometrical values so as to create a periodic signal at the programmed frequency. In the example, the periodic signal sent by the digital-to-analog converter has a frequency Fdds equal to 2.25 MHz, that is slightly less than one quarter of the frequency Fh of the oscillator 4 which clocks the synchronous circuitry of the direct digital frequency synthesis device 22. Typically, the ratio between this latter frequency Fh and the above-mentioned frequency Fdds is between ⅕ and ¼ Fh.

Accordingly, the oscillator 4 supplies a same clock signal to both the DDS circuit 22 and the digital-to-analog converter 24.

Note that the frequency Fh is low compared to the limits of the DDS circuit 22, which are generally situated an order of magnitude above, i.e. about 120 MHz.

Instead of being exploited directly as the output synthesis signal, the output of the direct frequency synthesis circuit 22 is supplied, via a band-pass filter 72, to a first input Em1 of a mixer 74 having two inputs Em1 and Em2 and one output Sm.

In accordance with the present invention, the second input Em 2 of the mixer 74 receives the signal at frequency Fh from the oscillator 4. This signal is supplied directly at the input Em 2 of the mixer 74.

Consequently, the output of the mixer 74 produces a mixture of frequencies comprising both the sum of the frequencies Fh and Fdds and the difference of these frequencies. The sum of these frequencies Fh and Fdds shall be designated Fref. This frequency Fref is thus equal to 10 MHz+2.25 MHz, i.e. 12.25 MHz, based on the figures of the example.

The mixer 74 thus performs a frequency transposition using for that transposition, in accordance with the invention, the same signal from the oscillator 4 as the one having served for generating the frequency Fdds. It should be noted here that the term transposition is used here and throughout this description to indicate a change in the frequency of a signal from one frequency to another. For the purposes of this description, the term may be used synonymously with the term translation.

The signal Sref at frequency Fref is extracted and separated from the mixture of frequencies produced by the mixer 74 using a band-pass filter 76 whose center frequency is fixed at Fref, i.e. 12.25 MHz in the example considered.

This frequency transposition at the level of the circuit is remarkable, notably from the viewpoint of gain in signal-to-noise ratio compared to the synthesis signal Sref of the same frequency that would have been obtained directly from circuits 22 and 24, and with an oscillator frequency Fh in that case equal to about 50 MHz.

Indeed, rather than simply using the linked function, i.e. the frequency of the direct synthesis circuit 22 which drives or which adds with the two local frequencies, this frequency Fdds is transposed in frequency with the reference frequency Fh itself.

When this operation is performed, the signal-to-noise ratio is improved by a factor of five (in the example considered): instead of operating at 12.25 MHz at the output of the DDS unit, such a frequency giving rise to problems as regards spikes, spectral purity, resolution, etc..., the operation is in fact performed at a frequency of 2.25 MHz, which is five times lower. However, this frequency is summed with the 10 MHz of the reference, which is always of high spectral quality (and which is also the reference frequency for the direct frequency synthesis circuit) to create a new frequency of 12.25 MHz. Thus, the gain in equivalent noise multiplied by a phase locked loop is 20 log 5, which is considerable and almost equal to 14 dB.

Moreover, because the oscillator 4 operates at the comparatively low frequency of 10 MHz, the resolution steps of the circuit are particularly fine for the output frequency Fref. Indeed, if the direct frequency synthesis circuit 22 is considered as constituting a 32-bit binary system, which is generally the case, then the elementary increment of that circuit is Fh/$2^{32}$ with Fh 10 MHz. This increment is identical after the transposition Fh+Fdds=Fref=12.25 MHz. In other words, the transposition in accordance with the invention provides here a gain in resolution by a factor of the order of five compared to a classical implementation where the frequency Fh of the oscillator must be on the order of 50 MHz.

There shall now be explained with reference to FIG. 8 an example of an application of the circuit of FIG. 7 in the context of a double transposition frequency synthesis circuit for bringing a signal initially modulated at a relatively low frequency of 18 MHz to the UHF band.

The double transposition circuit itself used in this example is the one described with reference to FIGS. 3 to 6. Accordingly, these aspects shall not be described again for conciseness. 30 The circuit 80 of FIG. 8 comprises four main blocks:

- the frequency synthesis circuit shown in FIG. 7, bearing figure reference 70 and shown enclosed in dotted lines. The filtered signal available at the output of the band-pass filter 76 is directed in a functionally symmetrical manner to the reference inputs of the two PLLs, i.e. the divider circuit 9a and 9b;
- two PLL circuits, referenced PLL 1 and PLL 2, each of mutually identical configuration except for the programming values of the input and output dividers, respectively R and N for PLL1 and T and Q for PLL2. These circuits are also similar to the circuit of FIG. 2, and their constituent parts bear the same references followed by the letter "a" or "b" depending on whether they refer to circuits PLL1 or PLL2 respectively. The programming of the PLLs so as to obtain the desired frequency in the present context is within the reach of the skilled person and shall not be described for conciseness; and
- a double transposition mixer and filter circuit 50 identical to the one already described with reference to FIG. 5.

The constituent parts of all these circuits shall not be described again, having already been detailed above.

The output of the frequency synthesis circuit 70 serves to provide the reference frequency Fref to each of the two PLL circuits (PLL1 and PLL2).

Circuit PLL1 serves to supply mixer 52 of the double transposition circuit 50 with the signal OL1 having the first transposition frequency Fol1.

Likewise, circuit PLL2 serves to supply mixer 56 of the double transposition circuit 50 with the signal OL2 at the second transposition frequency Fol2.

There shall now be described the operating principle and characteristics of circuit 80.

The circuit allows functions to be tied together.

The first of these functions is the frequency transposition to be performed.

A second function—in the case considered—is that of a wide band, fine resolution step UHF frequency synthesizer.

A noteworthy feature of the circuit is its integration of the two transposition frequencies Fol1 and Fol2 in its frequency plan so that, at the output, the equation for the frequency plan leads to the desired frequency.

The term frequency plan refers to the equations that enable, for a given frequency, to solve all the other intermediate calculations. This means that the positions of the other different frequencies are taken into account for the frequency wanted at the output. There is in this case a frequency at the input which is that of the reference signal at frequency Fh (10 MHz) and a desired UHF output frequency. The frequency plan defines the intermediate frequencies which are used. For example, frequency Fol1 is an intermediate frequency: this frequency is taken into account for summing the latter to that of Fol2.

In the present case, we transpose the signal to the UHF channel frequency in the fairly wide band of 470 to 860 MHz in 1 Hz steps, with the required phase noise characteristics.

To achieve this, we dispose of two basic techniques: direct digital synthesis and indirect synthesis based on PLL circuits.

When setting up the phase noise parameters, we must take into account the working frequency of the PLLs and the noise they generate by multiplying the ratio between the output frequency of each of the loops and the frequency at which they operate in comparison. In the prior art, in order to achieve the required phase noise, which is nevertheless at a good level, it is necessary to use by equivalence a multiple loop architecture.

Figure 8:
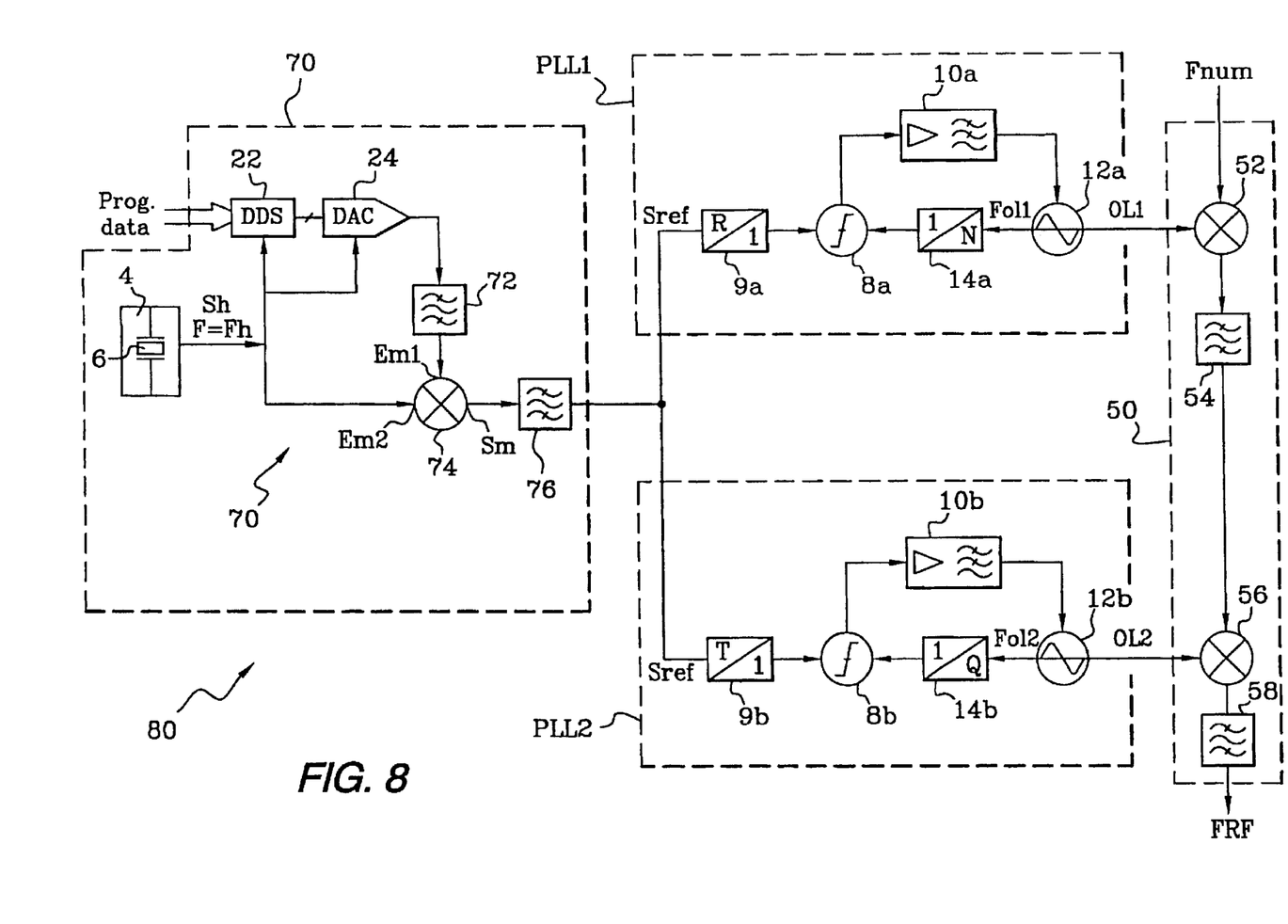
FIG. 8 is a block diagram of the circuit shown in FIG. 7, implemented in the double frequency transposition circuit of FIG. 5.

By contrast, in accordance with the circuit 80 of FIG. 8, the use of such embedded loops is avoided by using the fact that we can dispose of the fine resolution (loop PLL2) by generating an output frequency Fref on the basis of circuit 70. As explained above, this approach provides a large gain in the signal-to-noise ratio.

Next, with the frequency plan already integrating a double frequency transposition for transposing the modulated signal to be transmitted, we generate the small steps in the frequency jumps due to the PLL counters at two locations. However, when creating such small resolution steps, we have them for a given output frequency. From the moment we begin to perform a multiplication operation through a PLL at that frequency, the resolution is multiplied by the same factor. Thus, the first transposition, which is performed at that level, also benefits from the fivefold gain in resolution obtained by circuit 70.

Circuit 70 takes advantage of direct digital synthesis technology which today delivers output frequencies on the order of 30 to 40 MHz. However, if these circuits were to be used at such frequencies, we would have to employ a non-standard clock frequency, since the clock frequency for generating an output of 30 to 40 MHz is at least 3 or 4 times greater than that frequency. Now, no such oscillator having the quality and standard obtainable at 10 MHz is commercially available at present.

On the other hand, the invention allows to benefit from an original standard clock frequency of 10 MHz, which is widely used, to enable the circuit 70 to produce small resolution steps, while granting the benefit of an output frequency equal to 12.25 MHz in the example considered.

To use direct digital frequency generation in frequency synthesis loops of high spectral quality, as is the present invention, we take into account the restriction of use of the direct synthesis circuit in non-continuous frequency ranges. In other words, a continuous range of frequency variation at the output requires setting the digital synthesizer for use in a continuous frequency range. In the opposite case, we pass through critical cases where spikes are quite considerable. Accordingly, in order to avoid these phenomena, we set a limit in a frequency band. Because we are limited in frequency band, it is necessary to generate a frequency transposition so as not to suffer from the multiplicative effects of a PLL (Fol1 and Fol2).

Injecting such a variable frequency to achieve fine steps requires that the two PLLs—which also operate in the same frequency plan—no not disrupt each other by their own comparison frequencies and consequently in lock-induced spikes.

It is for this reason that each of the two PLLs receives exactly the same reference frequency at its input. Consequently, the two PLLs (PLL1 and PLL2) shall undergo the same fluctuations in their reference frequency and shall follow each other in the same way at the output. Thus, the respective spikes of each PLL shall never cross each other.

The optimization condition for the system requires that the locking frequencies Fol1 and Fol2 must be harmonics of each other. In other words, it is quite possible to extrapolate the two frequencies, chosen to be identical, at around 3 MHz as in the example, i.e. they have exactly the same value, but with one that would work at a rate twice less than that of the other or, in a more general way, at 2 power n of the other. In this case, the result is the same: we maintain the harmonic mode condition between the spikes and the latter do not interfere with each other. indeed, in PLL systems, when there are two loops having mutually different frequencies and working on the same application, they "see" each other insofar as the frequencies of the two PLLs create spurious beat frequencies. These frequencies will interfere with each other at a scale which may not be very considerable in terms of dB, but which is visible at the level of the spectrum. Depending on the desired frequency, the frequency plan shall move. When these frequencies start to move, the system passes through spurious frequency beats which are detectable but undesirable, and most of the time uncontrollable.

By contrast, we have exactly the same frequency between PLLs, in accordance with the invention, and thus no spurious beats.

As is clear, the invention is applicable to frequency synthesis systems that use more than two PLL circuits in parallel. In this case, all it takes is to solve the equations that set up the frequency plan. Indeed, for a desired output frequency, we have to calculate the reference frequency Fref. If the latter moves, so does the frequency Fol1. Now, if the latter moves, as it sums with the frequency Fol2 which moves too, we are then faced with an equation for the output which is difficult to solve. However, the calculation is always convergent, being of the first order. The fact that the two frequencies employed are based on the same signal all effects due to phase noise variation pass along the same chain for transposing the signal itself, through the principle of transposition frequency mixing. These effects only combine additively. Never do they multiply. When it is desired to avoid mutual beat effects through spurious beats, we must create the frequency transposition function to inject the desired frequency and extract the sum of the wanted beat. The phase noise at the output is only linked to the operation of the last loop PLL1. Indeed, the other loops are easier to implement since they only contribute to the phase noise at the output through the transposition, and thus it is the loop imposing the most constraint in frequency, and thus the last loop, which is involved in phase noise, this loop having a broad band. All the other loops are 10 to 12 dB bellow the output phase noise and only contribute less than 1 dB to the deterioration of the output noise spectrum. In the context of transmission at high frequencies, we are looking for a system which operates at a very high locking frequency, for this brings the advantage of having a very low noise base for the comparator, since the noise base of the desired comparison level is that of the comparator multiplied by 20 log (multiplication of the locking frequency times the desired output frequency). This level often conditions the spectrum between the integral pole and cutoff frequency of the loop's filter, which must be determined to optimize and satisfy the desired phase lock and stability criteria. Low division rates are kept to maintain a high comparison frequency. However, in order to have a small frequency increment step at the output, we use a reference frequency at the input of the PLLs which shifts sufficiently the frequency of the oscillators they lock, while minimizing its excursion so as to optimize the phase noise and spurious spikes in the spectrum. These low rates nevertheless make it possible to produce frequency increments which come to complete the output excursion range produced by the reference frequency variation at the inputs of the PLLs. To compensate for the loss in resolution, we exploit in the frequency plan the increments in the frequency Fol1, which are approximately 7 to 8 times less than the increments of the desired UHF frequency, so that its resolution by the same method is not deteriorated for so much, since it is degraded only in a ratio of 10. If we inject these fine increments multiplied by 10 only at the level of the signal transposition, we recover this fine resolution directly at the output so that, intrinsically, the architecture afforded by the invention allows to obtain a frequency resolution at the UHF output which is deteriorated only by a factor of 10 compared with the resolution of the direct digital synthesis circuit DDS in its use of the frequency Rh. The gain in resolution is then in the ratio of the frequency at the UHF output to the output frequency of the DDS circuit (2.25 MHz) deteriorated by 10 which, for a desired output frequency of 860 MHz, gives a gain of approximately 38. The double transposition makes it possible to sum the frequency resolution of the loop of the first local oscillator at frequency Fol1 to that of the second PLL loop (PLL2) whose frequency multiplication rate is higher. When we solve this system, we benefit from the resolution of the first loop, degraded only by the signal of frequency Fol1, and not by the signal Fol2 which only completes the possible frequency excursion.

The system makes it possible to work at a very high locking frequency, and hence with an optimized phase noise at the UHF output and FOL1 output. The output phase noise is virtually linked to the loop FOL2, but the resolution of the latter is in no way deteriorated since it is brought by the frequency Fol1. Furthermore, the resolution is transposed initially by the circuit 70 and we gain in this way a factor of six.

The following summarizes the remarkable characteristics of the invention as implemented in the context of the circuit of FIG. 8:

the provision of a first local oscillator of frequency Fol1 for the first transposition stage of the first modulated signal and a second modulated signal;

the provision of a second local oscillator of frequency Fol2 for the second transposition stage of the second modulated signal into a desired output;

the present architecture features an original frequency plan to generate the central frequency, either for the UHF band (470 to 860 MHz) or for the VHF band (170 to 230 MHz), i.e. broadcasting bands III, IV and V;

the small resolution steps rest on an architecture based on a synthesizer introduced into the general architecture so as to weaken the spurious noise levels. The architecture is used with the standard reference frequency (10 MHz) without multiplication of the latter. A frequency transposition makes it possible to raise the output frequency of the digital architecture to gain in phase noise and spike level near the central frequency, as well as in frequency resolution;

the architecture of FIG. 8 has only two phase locked loops to generate just the two frequencies Fol1 and Fol2 with a very good spectral quality complying with the standards in force for terrestrial digital television;

the architecture also features an economical optimization of industrial costs by integrating, among other things, the function of transposing the modulated signal within a same frequency plan.

What is claimed is:

1. A frequency transposition device, comprising:
    a frequency synthesis circuit (70), including:
        a logic circuit clocked by a clock signal (Sh) having a determined clock frequency (Fh) and provided by an oscillator (4);
        a direct digital synthesis device (22, 24) for producing via a calculation by the logic circuit a signal oscillating at a predetermined frequency (Fdds); and
        reference transposition means for transposing the signal which oscillates at the determined frequency (Fdds) using the clock frequency signal (Sh), the signal thus transposed being supplied as an output;
    k phase lock loops, where k is an integer greater than 1, each receiving, in a substantially identical manner, a reference signal (Sref) provided by the frequency synthesis circuit and having a predetermined frequency, at an input and delivering at an output a signal (OL1, OL2) of intermediate frequency (Fol1, Fol2) from the reference frequency signal (Sref); and
    frequency transposition means (50) including an input for a signal (Fnum) to be transposed, an output for a signal to be transposed in frequency (FRF) and at least one input for an intermediate frequency signal connected to a respective output of the phase locked loop means.

2. A device according to claim 1, characterized in that the frequency transposition performed by the reference transposition means is performed by summing means (74) for summing the clock frequency (Fh) and said determined frequency (Fdds) outputted from the direct digital synthesis device (22, 24).

3. A device according to claim 2, characterized in that the summing means comprise a mixer (74) having a first input (Em1) for receiving the oscillating signal (Fdds) produced by the direct digital synthesis device (22, 24), a second input (Em2) for receiving the clock signal (Sh) and an output (Sm) supplying the sum and the difference of the frequencies of the clock signal and the oscillating signal (Fdds) outputted by the direct digital synthesis device.

4. A device according to claim 1, characterized in that it further comprises filtering means (76) for filtering the oscillating signal (Fdds) outputted from the direct digital synthesis device (22, 24) upstream of the transposition means.

5. A device according to claim 1, characterized in that the direct digital synthesis device (22, 24) comprises a direct digital synthesis unit (22) producing digital numbers corresponding to trigonometrical values of successive phase angles including a digital-to-analog converter (24) for converting said values into analog voltages, said converter being clocked by said clock signal (Sh) from the oscillator (4).

6. A device according to claim 1, characterized in that it comprises an oscillator which produces said clock signal at a frequency on the order of 10 MHz.

7. A device according to claim 6, characterized in that said determined frequency (Fdds) produced by said direct digital frequency synthesis device (22, 24) is on the order of 2.25 MHz, so that, after transposition by the reference transposition means, the signal (Sref) at the output after filtering is on the order of 12.25 MHz.

8. A device according to claim 1, characterized in that each phase locked loop (PLL1, PLL2) comprises a programmable divide by R (or T) means operative on the frequency (Fref) of said reference signal (Sref), where R (or T) is an integer or a fraction.

9. A device according to claim 1, characterized in that the frequency transposition means (50) comprise, for each phase locked loop (PLL1, PLL2), a mixer (52, 56) having a first input for receiving either the input signal (Fnum) to be transposed, or an intermediate transposition of that signal, and a second input for receiving a signal (OL1, OL2) of intermediate frequency (Fol1, Fol2) from a respective phase locked loop (PLL1, PLL2), and an output for the mixture of the frequencies of the signals.

10. A device according to claim 1, characterized in that k=2.

11. A device according to claim 9, characterized in that one of said mixers (52) receives at its first input the input signal (Fnum) to be transposed and supplies at its output a signal which is applied to the first input of a mixer (56) located downstream, via a band-pass filter.

12. A device according to claim 1, characterized in that:
the clock frequency (Fh) of the oscillator (4) is one the order of 10 Mhz;
the reference frequency (Fref) of the signal (Sref) produces by said frequency synthesis circuit is on the order of 12.25 MHz;
a first of the phase locked loops (PLL1) serving to produce the signal (OL1) for a first mixer (52) has a frequency on the order of 120 MHz; and
a second of the phase locked loops (PLL2) serving to produce the signal (OL2) for a second mixer has a frequency on the order of 300 to 720 MHz.

13. A device according to claim 1, wherein the input signal (Fnum) is a modulated signal and the frequency transposition means (50) transposes the input signal to a VHF or UHF frequency range for transmission.

14. A device according to claim 1, wherein the signal (FRF) outputted from the frequency transposition means is provided to drive a power amplification circuit of a transmitter with a modulated signal transposed in frequency.

15. A device according to claim 1, wherein the input signal is a signal modulated in a VHF or UHF frequency range and the output signal from the frequency transposition means (50) is a low frequency modulated signal.

16. A method of transposing a frequency, comprising:
using a direct digital synthesis device (22, 24) to produce by calculation a signal oscillating at a determined frequency (Fdds), said calculation being performed by a logic circuit clocked by a clock signal (Sh) having a determined clock frequency (Fh), characterized in that the signal oscillating at the determined frequency (Fdds) is transposed by the frequency of the clock signal (Sh), the signal thus transposed being supplied as an output;
receiving at the inputs of k phase locked loop means, where k is an integer greater than 1, a reference signal (Sref) provided by the direct digital synthesis circuit, where each of the k phase locked loops receives the input signal in a substantially symmetrical and balanced matter;
delivering at the outputs of the k phase locked loop means, a signal (OL1, OL2) of intermediate frequency (Fol1, Fol2) from the reference frequency signal (Sref); and
transposing a signal at a frequency transposition means comprising an input for a signal (Fnum) to be transposed, an output for a signal transposed in frequency (FRF) and at least one input for an intermediate frequency signal connected to a respective output of the phase locked loop means.

17. Method according to claim 16, characterized in that the frequency transposition of the oscillating signal by the frequency of the clock signal (Sh) is performed by summation of the clock frequency (Fh) and said determined frequency (Fdds) obtained from the direct digital synthesis device.

18. Method according to claim 17, characterized in that the summation is performed by a mixer (74) having a first input (Em1) for receiving the oscillating signal (Fdds) produced by the direct digital synthesis device (22, 24), a second input (Em2) for receiving the clock signal (Sh) and an output (Sm) supplying the sum and the difference of the frequencies of the clock signal and the oscillating signal (Fdds) outputted from the direct digital synthesis device (22, 24).

19. Method according to claim 16, characterized in that it further comprises the step of filtering the oscillating signal (Fdds) outputted from the direct digital synthesis device (22, 24) upstream of the transposition of the oscillating signal by the frequency of the clock signal (Sh).

20. Method according to claim 16, characterized in that the direct digital synthesis (22, 24) is performed using a direct digital synthesis unit (22) producing digital numbers corresponding to trigonometrical values of successive phase angles, comprising a memory for sinusoidal waveforms, and a digital-to-analog converter (24) for converting these values into analog voltages, said converter being clocked by said clock signal (Sh) of the oscillator (4).

21. Method according to claim 16, characterized in that said clock signal has a frequency on the order of 10 MHz.

22. Method according to claim 21, characterized in that said frequency (Fdds) produced by said direct digital synthesis circuit (22, 24) is on the order of 2.25 MHz, so that the transposed frequency (Fref) of the signal (Sref) at the output is on the order of 12.25 MHz.

23. Method according to claim 16, characterized in that each phase locked loop (PLL1, PLL2) comprises a programmable divide by R (or T) means operative on the frequency (Fref) of said reference signal (Sref), where R (or T) of each of the loops is a multiple or sub-multiple and harmonic relative to one another.

24. Method according to claim 16 characterized in that the frequency transposition performed by the frequency transposition means (50) is performed for each phase locked loop (PLL1, PLL2), by a mixer (52, 56) having a first input for receiving either the input signal (Fnum) to be transposed, or an intermediate transposition of that signal, and a second input for receiving a signal (OL1, OL2) of intermediate frequency (Fol1, Fol2) from a respective phase locked loop (PLL1, PLL2), and an output for the mixture of the frequencies of the signals.

25. Method according to claim 16, characterized in that k=2.

26. Method according to claim 24, characterized in that one of said mixers (52) receives at its first input the input signal (Fnum) to be transposed and has its output connected, via a band-pass filter (54), to the first input of a mixer (56) located downstream.

27. Method according to claim 16, characterized in that:

the clock frequency (Fh) of the oscillator (4) is on the order of 10 Mhz;

the reference frequency (Fref) of the signal (Sref) produced by said frequency synthesis circuit is on the order of 12.25 MHz;

a first of the phase locked loops (PLL1) serving to produce the signal (OL1) for a first mixer (52) has a frequency on the order of 120 MHz; and a second of the phase locked loops (PLL2) serving to produce the signal (OL2) for a second mixer (56) has a frequency on the order of 300 to 720 MHz.

* * * * *